(12) United States Patent
Nakahara et al.

(10) Patent No.: US 8,062,765 B2
(45) Date of Patent: Nov. 22, 2011

(54) SILVER LAYER FORMED BY ELECTROSILVERING SUBSTRATE MATERIAL

(75) Inventors: Youichiro Nakahara, Tsu (JP); Naoto Ikegawa, Tsu (JP)

(73) Assignee: Panasonic Electric Works, Ltd., Osaka (JP)

( * ) Notice: Subject to any disclaimer, the term of this patent is extended or adjusted under 35 U.S.C. 154(b) by 1011 days.

(21) Appl. No.: 11/773,692

(22) Filed: Jul. 5, 2007

(65) Prior Publication Data

US 2008/0006911 A1  Jan. 10, 2008

(30) Foreign Application Priority Data

Jul. 6, 2006  (JP) ................. 2006-187053

(51) Int. Cl.
B32B 15/01 (2006.01)
B32B 15/20 (2006.01)
C25D 3/46 (2006.01)
(52) U.S. Cl. ......... 428/673; 428/671; 428/687; 205/263
(58) Field of Classification Search .......... None
See application file for complete search history.

(56) References Cited

U.S. PATENT DOCUMENTS

| | | | |
|---|---|---|---|
| 5,145,753 A | 9/1992 | Irino et al. | |
| 6,126,761 A | 10/2000 | DeHaven et al. | |
| 6,336,753 B1 | 1/2002 | Kihira et al. | |
| 6,483,623 B1 | 11/2002 | Maruyama | |
| 7,268,014 B2 | 9/2007 | Lee et al. | |
| 2001/0024087 A1 | 9/2001 | Suehiro et al. | |
| 2002/0132109 A1 | 9/2002 | Hatakeyama et al. | |
| 2004/0005432 A1 | 1/2004 | Ridout et al. | |

FOREIGN PATENT DOCUMENTS

| | | |
|---|---|---|
| CN | 2754213 | 1/2006 |
| EP | 1 670 295 | 6/2006 |
| JP | 01-283883 | 11/1989 |
| JP | 04-066695 | 3/1992 |
| JP | 05-002940 | 1/1993 |
| JP | 05-323048 | 12/1993 |
| JP | 7-231152 | 8/1995 |
| JP | 08-283963 | 10/1996 |
| JP | 2000-155205 | 6/2000 |
| JP | 2000-261040 | 9/2000 |
| JP | 2005-347375 | 12/2005 |
| JP | 2006-155899 | 6/2006 |
| KR | 0593943 | 6/2006 |
| WO | 2004/001101 | 12/2003 |

OTHER PUBLICATIONS

English language Abstract JP 7-231152.
English language Abstract JP 2006-155899.
Bersirova et al., "Electrodeposition of functional silver coatings from buffered baths," *Chemija* 14(1):16-21 (2003), XP002481380.

(Continued)

*Primary Examiner* — Timothy M Speer
*Assistant Examiner* — Jason L Savage
(74) *Attorney, Agent, or Firm* — Greenblum & Bernstein, P.L.C.

(57) ABSTRACT

The inventors have conducted vigorous studies, and discovered as a result that it is possible to form a silver layer having a high reflectance of about 90 to 99% in a visible light area by setting a grain size of an outermost surface of a silver plated layer within a range of 0.5 μm or more to 30 μm or less.

12 Claims, 7 Drawing Sheets

OTHER PUBLICATIONS

Zarkadas et al., "Silver electrodeposition from $AgNO_3$ solutions containing organic additives: Electrodeposition from binary water-methanol solvent systems in the presence of tartaric acid," *Journal of Applied Electrochemistry* 34:607-615 (2004), XP002481381.
English language Abstract of KR 0593943.
English language Abstract of JP 2000-155205.
English language Abstract of JP 05-002940.
English language Abstract of JP 08-283963.
English language Abstract of JP 04-066695.
English language Abstract of JP 05-323048.
English language Abstract of JP 2005-347375.
English language Abstract of JP 2000-261040.
English language Abstract of JP 01-283883.
The Official Action (in Japanese).
English language Abstract of CN2754213.
Taiwanese Office Action dated Jun. 23, 2011, and an English language translation thereof, in counterpart Taiwanese patent application No. 096124730.

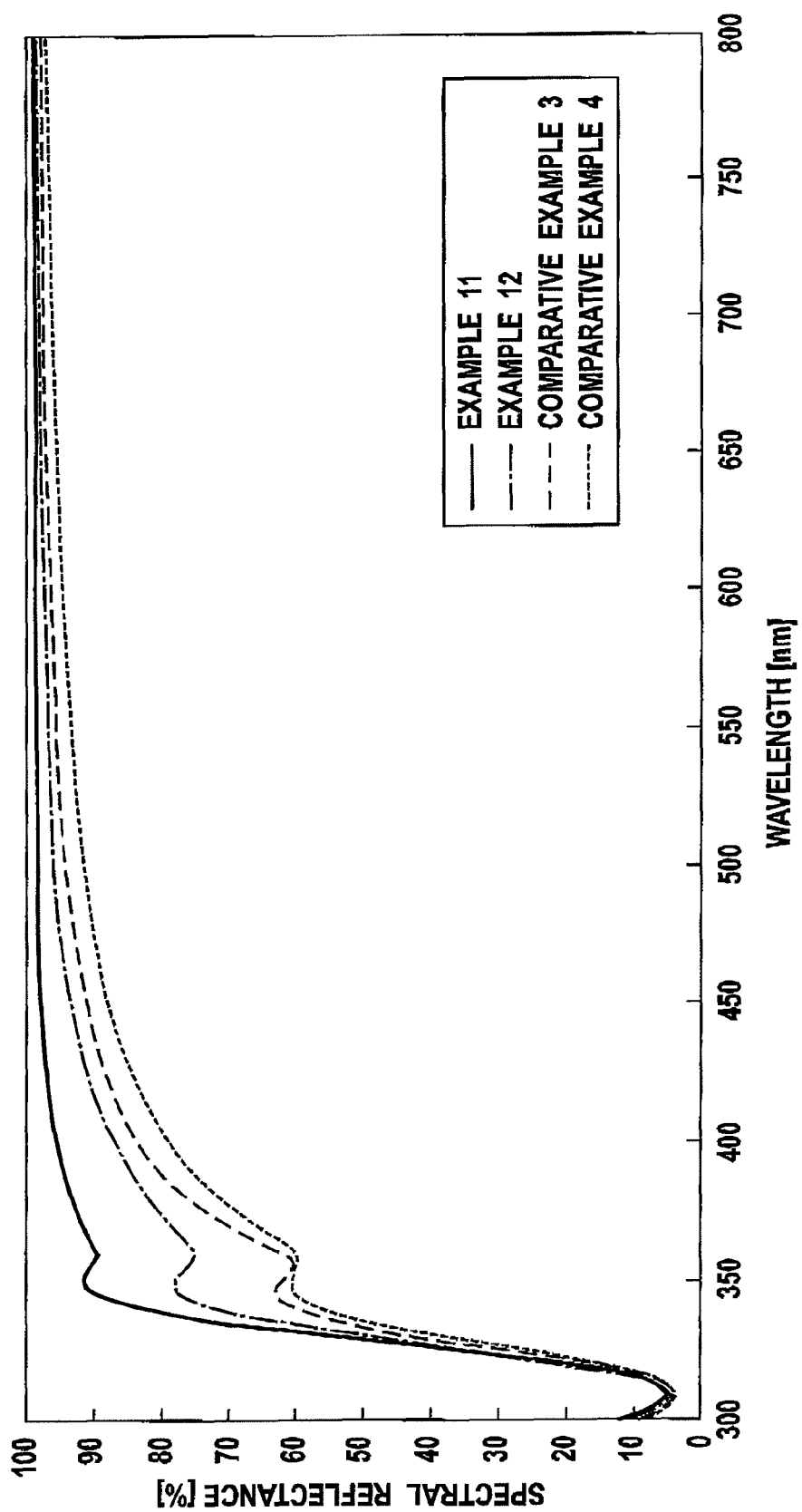

SILVER LAYER FORMED BY ELECTROSILVERING SUBSTRATE MATERIAL

CROSS REFERENCE TO RELATED APPLICATION

This application is based upon and claims the benefit of priority from a Japanese Patent Application No. TOKUGAN 2006-187053, filed on Jul. 6, 2006; the entire contents of which are incorporated herein by reference.

BACKGROUND OF THE INVENTION

1. Field of the Invention

The present invention relates to a silver layer formed by electrosilvering a substrate material.

2. Description of the Related Art

The silver layer has a high light reflectance (abbreviated to reflectance herein after), and thus it has widely been used for a reflecting plate of downlight illumination or a reflective surface of a light emitting diode (LED) package. In the case of the LED package, as a current input to the LED is increased until a predetermined light output is obtained, a life of the LED is greatly affected. Accordingly, in a high-output LED package applied for house illumination or main illumination of an automobile headlight or the like, spectral characteristics of the reflective surface are extremely important elements to decide product performance, requiring a reflectance as high as possible. Specifically, the silver layer has to have a high reflectance in all wavelength areas (400 to 700 nm) of visible lights. However, as a reflectance drops in a wavelength area of 400 to 500 nm near a LED excitation wavelength, it is important to increase the reflectance in this wavelength area. Under these circumstances, a method for increasing a reflectance of a silver layer, such as a method disclosed in Japanese Patent Application Laid-Open No. 2000-155205, has recently been proposed. According to this conventional method, however, as a silver layer is formed by electroless plating, it takes about 10 to 30 minutes to form a film with a thickness of 200 nm, and productivity is extremely low. Besides, running costs are high because a life of bathing used for the plating is short.

The present invention has been developed to solve the aforementioned problems, and it is an object of the invention to provide a silver layer high in productivity and reflectance in a visible light area, and its manufacturing method.

It is another object of the present invention to provide a LED mounted substrate which includes a silver layer high in productivity and reflectance in a visible light area as a reflective surface, and its manufacturing method.

SUMMARY OF THE INVENTION

The inventors have conducted vigorous studies, and discovered as a result that a silver layer having a high reflectance of about 90 to 99% in a visible light area can be formed by setting a grain size of an outermost surface of a silver plated layer within a range of 0.5 µm or more to 30 µm or less. Preferably, the silver plated layer has a film thickness of 1 µm or more, and a substrate material is copper. This configuration enables realization of a high reflectance even when the film thickness of the silver plated layer is small, and thus productivity can be increased. The silver plated layer may have a film thickness of 4 µm or more, and a substrate material may be nickel. This configuration enables prevention of diffusion of the copper through the silver plated layer when the substrate material is copper, and thus a high reflectance can be maintained for a long time. Moreover, bonding reliability can be increased when a chip such as a LED is mounted.

Preferably, surface roughness of the substrate material is 0.5 µm or more. This configuration enables realization of a high reflectance by limiting a film thickness of the silver plated layer to a minimum, and thus productivity can be increased. When the substrate material is nickel, preferably, the nickel contains no sulfur. This configuration enables a reflectance as high as the aforementioned to be obtained even when a film thickness of the silver plated layer is small, and corrosion resistance to be increased.

In the case of manufacturing the silver layer, preferably, the silver plated film is heated at a temperature of 200° C. or more for 30 seconds or more. According to this manufacturing method, by reducing a crystal grain boundary, it is possible to increase a reflectance in a low wavelength area (400 to 500 nm) of a visible light area near an excitation wavelength of a blue LED. In the case of manufacturing the silver layer, preferably, electrosilvering is carried out by low-cyan bathing.

No brightening agent has to be added in the low-cyan bath. As measurement of a brightening agent concentration used for electroplating is impossible by a current analysis technology, it is practically impossible to strictly determine the quantity of, maintain or manage a brightening agent concentration in the plating bath. Thus, a plating bath containing no brightening agent can maintain constant manufacturing quality more easily.

A LED mounted substrate may be manufactured by using the silver layer as a reflective surface. By using such a LED mounted substrate, a light emitted from the LED can be efficiently reflected. In this case, preferably, the LED mounted substrate is manufactured by forming a conductive layer on a substrate surface, patterning the conductive layer to form a circuit pattern, forming a copper plated layer on the circuit pattern, forming a nickel plated layer on the silver plated layer, and forming a silver plated layer on the nickel plated layer.

BRIEF DESCRIPTION OF THE DRAWINGS

Exemplary embodiments of the invention will become more fully apparent from the following description and appended claims, taken in conjunction with the accompanying drawings. Understanding that these drawings depict only exemplary embodiments and are, therefore, not to be considered limiting of the invention's scope, the exemplary embodiments of the invention will be described with additional specificity and detail through use of the accompanying drawings in which:

FIG. 9 is a diagram showing a change in reflectance which accompanies a difference in a type of bath used for silver plating.

DETAILED DESCRIPTION OF THE PREFERRED EMBODIMENTS

The present invention can be applied to, for example, a manufacturing process of a LED mounted substrate which includes a silver plated layer as a reflective surface. Referring to FIGS. 1A to 1H, the manufacturing process of the LED mounted substrate according to an embodiment of the invention will be described.

[Manufacturing Process of LED Mounted Substrate]

Figure 1A:
FIGS. 1A to 1H are sectional flow diagrams showing a manufacturing process of a LED mounted substrate according to an embodiment of the present invention.
Figure 1B:

In the manufacturing process of the LED mounted substrate according to the embodiment of the invention, first, as shown in FIG. 1A, an insulating substrate (abbreviated to substrate herein after) 1 made of a ceramic base material such as alumina (purity of 92 to 99%), aluminum nitride or silicon carbide, or a heat-resistive polymer base material such as a crystal polymer (LCP) or PEED® is formed. Then, as shown in FIG. 1B, metal films 2 are formed in both surfaces of the substrate 1. For the metal films 2, preferably, metal materials such as copper, chromium, titanium, nickel, or platinum having high adhesiveness to the substrate 1 are used The metal films 2 are preferably formed by a physical deposition method such as vacuum deposition or ion plating. However, the invention is not limited to such a method. For example, the metal films 2 may be formed by electroless plating.

Figure 1C:
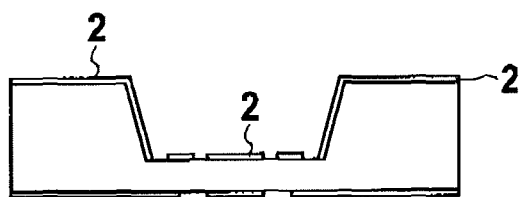
Figure 1D:
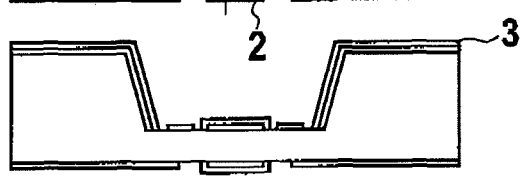
Figure 1E:
Figure 1F:
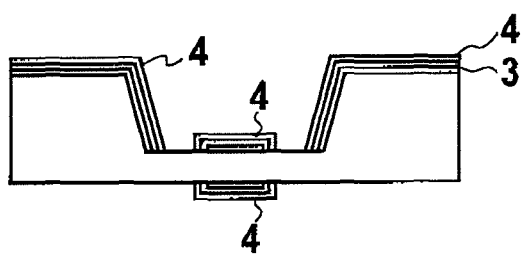

Then, as shown in FIG. 1C, laser beams are applied to the metal films 2 along a boundary between a circuit forming section and an non-circuit forming section by using One-shot Laser Structuring (Laser structuring process is utilized in ablating copper, and creating the outline of the required circuit) to remove the metal film 2 from the boundary portion, thereby separating the metal film 2 of the circuit forming section as a circuit pattern from other portions of the metal films 2. As shown in FIG. 1D, a thick copper plated layer 3 is formed by turn electricity on the metal film 2 of the circuit forming section and using a copper plating bath of one selected from copper sulfate, copper cyanide, copper pyrophosphate, and copper fluoroborate to execute electric copper plating. As shown in FIG. 1E, the metal film 2 left in the non-circuit forming section is removed by soft etching using one selected from ammonium persulfate, a nitric acid, a sulfuric acid, and a hydrochloric acid. A desired circuit pattern is formed by leaving the electric copper plated circuit forming section. As shown in FIG. 1F, both surfaces of the substrate 1 are electrically plated with nickel by using one selected from Watts bath, a sulfamate bath, a citrate bath, a fluoroborate bath, a full chloride bath, and a full sulfate bath, thereby forming a nickel plated layer 4. The bath used for electric nickel plating is not limited to the aforementioned example. Commercial special baths may be used. It is not always necessary to form a nickel plated layer 4.

Figure 1G:
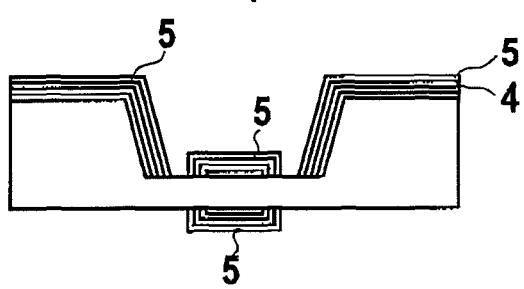
Figure 1H:
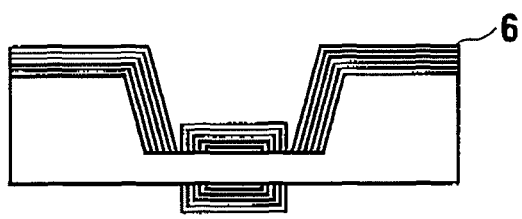
Figure 2:
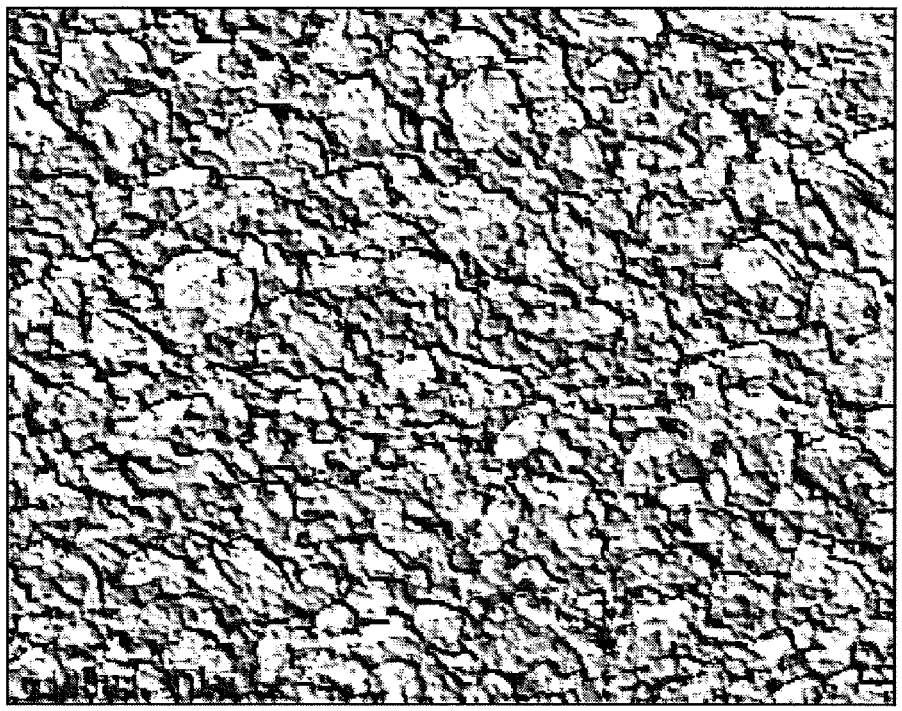
FIG. 2 is a diagram showing a SEM photograph of a silver plated layer surface according to Example 1.
Figure 3:
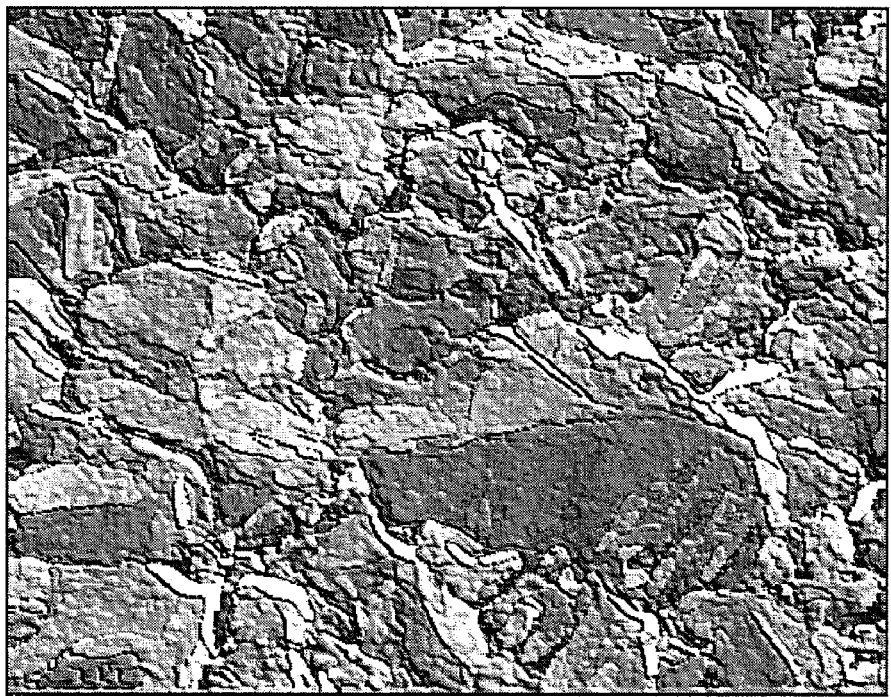
FIG. 3 is a diagram showing a SEM photograph of a silver plated layer surface according to Example 2.
Figure 4:
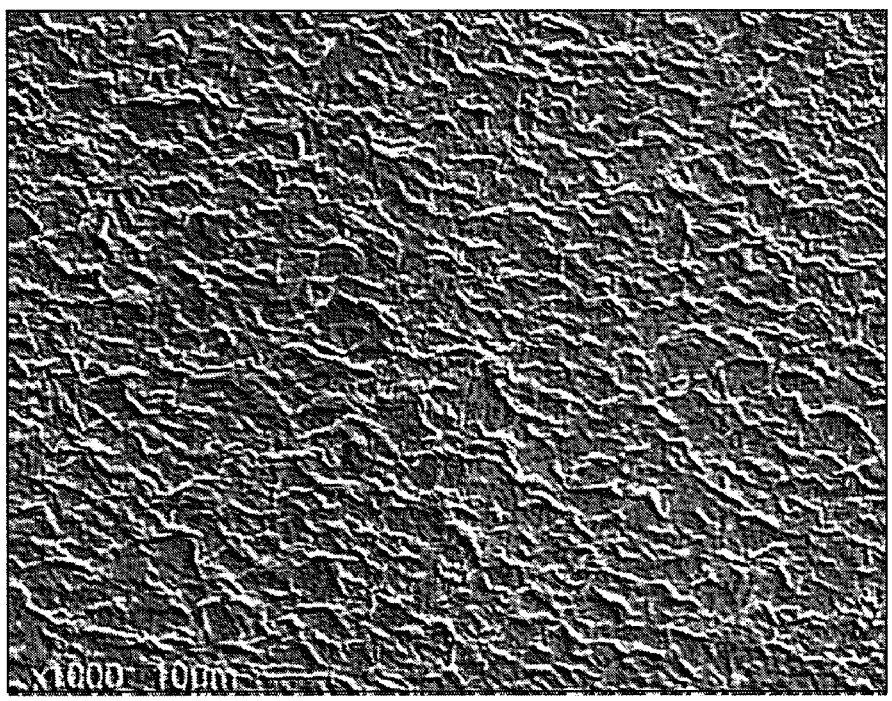
FIG. 4 is a diagram showing a SEM photograph of a silver plated layer surface according to Example 3.
Figure 5:
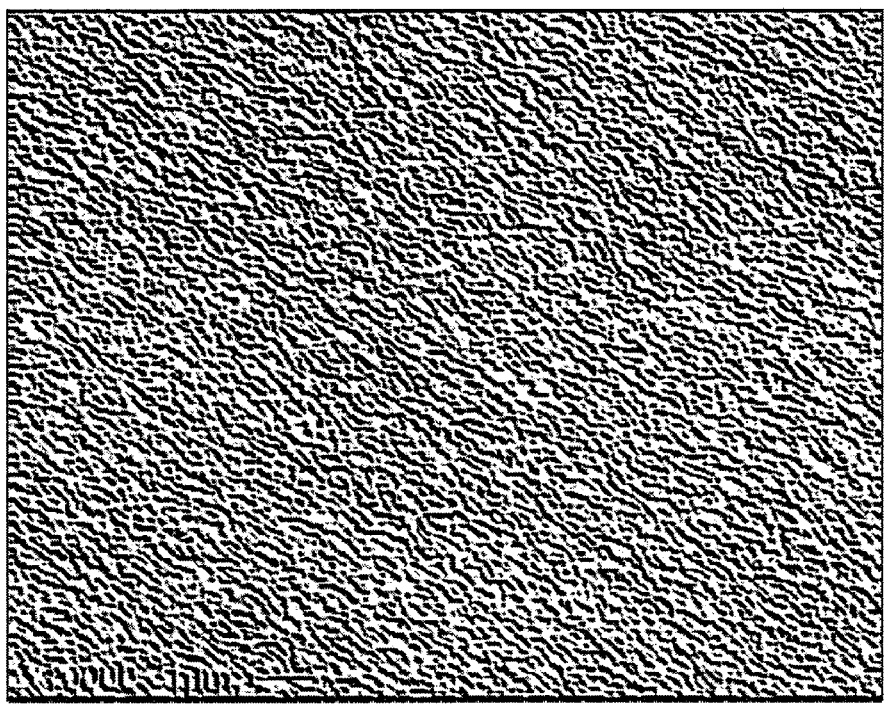
FIG. 5 is a diagram showing a SEM photograph of a silver plated layer surface according to Comparative Example 1.
Figure 6:
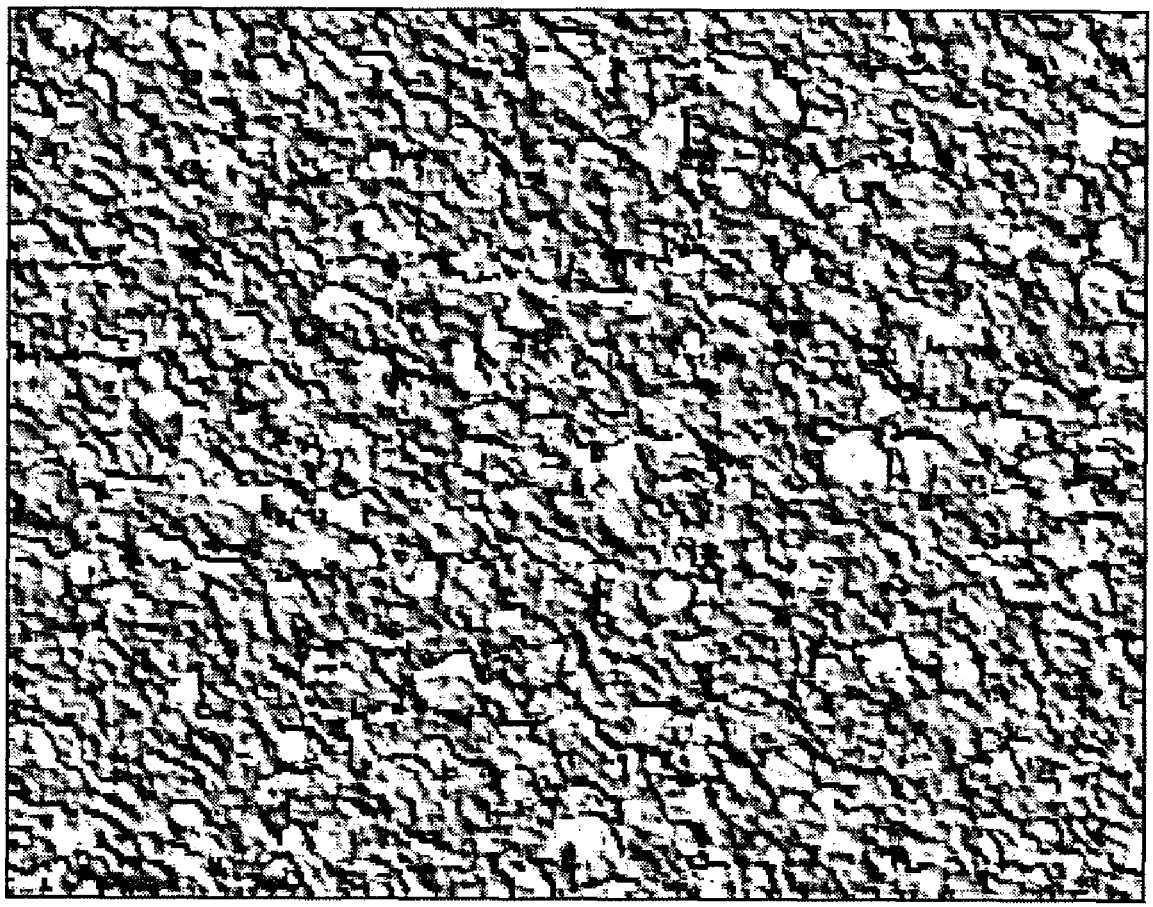
FIG. 6 is a diagram showing a SEM photograph of a silver plated layer surface according to Comparative Example 2.

Then, as shown in FIG. 1G, to secure an adhesive force of a silver plated layer 6 (described below) to the substrate material, a strike plated layer 5 is formed by subjecting the substrate 1 to electric strike plating. For the electric strike plating, one selected from silver strike, copper strike, gold strike, palladium strike, and nickel strike may be used. From the standpoint of costs and long-term reliability, however, the copper strike or the silver strike is used. Lastly, as shown in FIG. 1H, a silver plated layer 6 is formed by electrosilvering both surfaces of the substrate 1 (described below in detail), and then a series of manufacturing steps is finished. The manufactured LED mounted substrate may be cut as occasion demands.

[Electrosilvering]

Next, the preferred modes of the electrosilvering process will be described through Examples and Comparative Examples.

[Grain Size and Surface Roughness of Substrate Material]

The inventors formed silver plated layers of Examples 1 to 3 and Comparative Examples 1 and 2 by methods described below, and examined relations between outermost surface grain sizes and surface roughness of substrate materials of the silver plated layers of the Examples 1 to 3 and the Comparative Examples 1 and 2 and reflectances.

EXAMPLE 1

According to the Example 1, first, an alumina substrate of a flat plate shape (30×40×1.5 mm) was prepared. The substrate was dipped in a copper sulfate bath of a copper sulfate/pentahydrate concentration of 110 g/l, a sulfuric acid concentration 180 g/l and a chlorine ion concentration of 50 mg/l. The substrate was subjected to electric copper plating at a temperature of 22° C. for 136 seconds by setting current density to 2 A/dm$^2$ to form a copper plated layer with a film thickness of 10 µm on a substrate surface. Then, the substrate was dipped in a low (concentration) cyan bath of a silver concentration of 65 g/l, a free cyanide concentration of 2 g/l, and a brightening agent concentration of 10 ml/l. The substrate was subjected to electrosilvering at a temperature 30° C. for 95 seconds by setting a current density to 2 A/dm$^2$ to obtain a silver plated layer of the Example 1 with a film thickness of 2 µm on the copper plated layer.

EXAMPLE 2

According to the Example 2, a substrate was dipped in a low cyan bath of a silver concentration of 65 g/l, a free cyanide concentration 2 g/l and a brightening agent concentration of 0 ml/l. The substrate was subjected to electrosilvering at a temperature 30° C. for 750 seconds by setting a current density to 2 A/dm$^2$ to obtain a silver plated layer of the Example 2 with a film thickness of 16 µm on the copper plated layer.

EXAMPLE 3

According to the Example 3, a substrate was dipped in a low cyan bath of a silver concentration of 65 g/l, a free cyanide concentration of 2 g/l, and a brightening agent concentration of 0 ml/l. The substrate was subjected to electrosilvering at a temperature 60° C. for 190 seconds by setting a current density to 2 A/dm$^2$ to obtain a silver plated layer of the Example 3 with a film thickness of 4 µm on the copper plated layer.

COMPARATIVE EXAMPLE 1

According to the Comparative Example 1, a substrate was dipped in a high (concentration) cyan bath of a silver concentration of 40 g/l, a free cyanide concentration of 120 g/l, a potassium carbonate concentration of 30 g/l, and a brightening agent concentration of 30 ml/l. The substrate was subjected to electrosilvering at a temperature 25° C. for 190 seconds by setting a current density to 2 A/dm$^2$ to obtain a silver plated layer of the Comparative Example 1 with a film thickness of 4 μm on the copper plated layer.

COMPARATIVE EXAMPLE 2

According to the comparative Example 2, a substrate including a copper plated layer was dipped in Watts bath of a nickel sulfate concentration of 300 g/l, a nickel chloride concentration 45 g/l and a boric acid concentration of: 30 g/l. The substrate was subjected to electric nickel plating at a temperature of 50° C. for 730 seconds by setting current density to 2 A/dm$^2$ to form a nickel plated layer with a film thickness of 6 μm on the copper plated layer. Then, the substrate was dipped in a low cyan bath of a silver concentration of 65 g/l, a free cyanide concentration of 2 g/l, and a brightening agent concentration of 10 ml/l The substrate was subjected to electrosilvering at a temperature 30° C. for 50 seconds by setting a current density to 2 A/dm$^2$ to obtain a silver plated layer of the Comparative Example 2 with a film thickness of 1 μm on the nickel plated layer.

[Evaluation]

FIGS. 2 to 4 and FIGS. 5 and 6 respectively show SEM photographs of outermost surfaces of the silver plated layers of the Examples 1 to 3 and the Comparative Examples 1 and 2 (magnification rate is 1000 in the case of the Example 3, while magnification rates are 10000 in the other examples). Table 1 shows grain sizes of the silver plated layer outermost surfaces measured from the SEM photographs. As shown in Table 1, the grain sizes of the outermost surfaces of the silver plated layers of the Comparative Examples 1 and 2 are 1 μm, while the grain sizes of the outermost layers of the silver plated layers of the Examples 1 to 3 are within a range of 1 to 20 μm. Surface roughness Ry of a substrate material of each silver plated layer was measured. As shown in Table 2, surface roughness. By of each of the Comparative Examples is 0.5 or less, while surface roughness Ry of each of the Examples 1 to 3 is 0.5 or more.

TABLE 1

|  | GRAIN SIZE | SPECTRAL REFLECTANCE | |
|---|---|---|---|
|  |  | @400 nm | @700 nm |
| COMPARATIVE EXAMPLE 1 | <1 μm | 83.4% | 97.4% |
| COMPARATIVE EXAMPLE 2 | <1 μm | 79.0% | 95.7% |
| EXAMPLE 1 | 1~2 μm | 90.5% | 98.1% |
| EXAMPLE 2 | 1~10 μm | 94.1% | 99.3% |
| EXAMPLE 3 | 15~20 μm | 92.2% | 98.6% |

TABLE 2

|  | SURFACE ROUGHNESS | SPECTRAL REFLECTANCE | |
|---|---|---|---|
|  | Ry | @400 nm | @700 nm |
| COMPARATIVE EXAMPLE 1 | 0.41 μm | 83.4% | 97.4% |
| COMPARATIVE EXAMPLE 2 | 0.47 μm | 79.0% | 95.7% |
| EXAMPLE 1 | 0.79 μm | 90.5% | 98.1% |
| EXAMPLE 2 | 1.93 μm | 94.1% | 99.3% |
| EXAMPLE 3 | 1.27 μm | 92.2% | 98.6% |

By using a spectrophotometer (U 4000 by Hitachi, Ltd.), spectral reflectances of the silver plated layers of the Examples 1 to 3 and the Comparative Examples 1 and 2 for visible lights of wavelengths 400 nm and 700 nm were measured. As shown in Table 1, the spectral reflectances of the silver plated layers of the Examples 1 to 3 are higher than those of the silver plated layers of the Comparative Examples 1 and 2. Accordingly, it is possible to manufacture a silver plated layer of a high reflectance by controlling a grain site of the outermost surface of the silver plated layer to about 0.5 to 30 μm, preferably 1 to 10 μm. By setting surface roughness of the substrate material to 0.5 μm or more, a high reflectance can be realized by limiting a film thickness of the silver plated layer to a minimum.

[Film Thickness]

Silver plated layers of Examples 4 to 7 were formed by using methods below, and changes in reflectance accompanying changes in film thickness of the silver plated layers were measured.

EXAMPLE 4

According to the Example 4, a substrate including a copper plated layer was dipped in a low cyan bath of a silver concentration of 65 g/l, a free cyanide concentration 2 g/l and a brightening agent concentration of 0 ml/l When a temperature was 30° C., and a current density was set to 2 A/dm$^2$, a deposition speed was 1.28 μm/minute, and the substrate was subjected to electrosilvering by changing time to obtain a silver plated layer of the Example 4 with a different film thickness on the copper plated layer.

EXAMPLE 5

According to the Example 5, a substrate including a copper plated layer was dipped in a low cyan bath of a silver concentration of 65 g/l, a free cyanide concentration of 2 g/l, and a brightening agent concentration of 10 ml/l. When a temperature was 30° C., and a current density was set to 2 A/dm$^2$, a deposition speed was 1.28 μm/minute, and the substrate was subjected to electrosilvering by changing time to obtain a silver plated layer of the Example 5 with a different film thickness on the copper plated layer.

EXAMPLE 6

According to the Example 6, first, a substrate including a copper plated layer was dipped in Watts bath (Sulnic AMT, C. Uyemura & Co., Ltd.) containing no commercial sulfur. The substrate was subjected to electric nickel plating to form a nickel plated layer on the copper plated layer. Then, the substrate was dipped in a low cyan bath of a silver concentration of 65 g/l, a free cyanide concentration of 2 g/l, and a brightening agent concentration 10 ml/l. When a temperature was 30° C., and a current density was to 2 A/dm$^2$, a deposition speed was 1.28 μm/minute, and the substrate was subjected to electrosilvering by changing time to obtain a silver plated layer of the Example 6 with a different film thickness on the nickel plated layer.

EXAMPLE 7

According to the Example 7, a substrate including a copper plated layer was dipped in watts bath of a nickel sulfate concentration of 300 g/l, a nickel chloride concentration 45 g/l and a boric acid concentration of 3 μg/l. The substrate was subjected to electric nickel plating to form a nickel plated layer on the copper plated layer. Then, the substrate was dipped in a low cyan bath of a silver concentration of 65 g/l, a free cyanide concentration of 2 g/l, and a brightening agent concentration of 10 ml/l. When a temperature was 30° C., and a current density was set to 2 A/dm², a deposition speed was 1.28 μm, and the substrate was subjected to electrosilvering by changing time to obtain a silver plated layer of the Example 7 with a different film thickness on the nickel plated layer.

[Evaluation]

Figure 7:
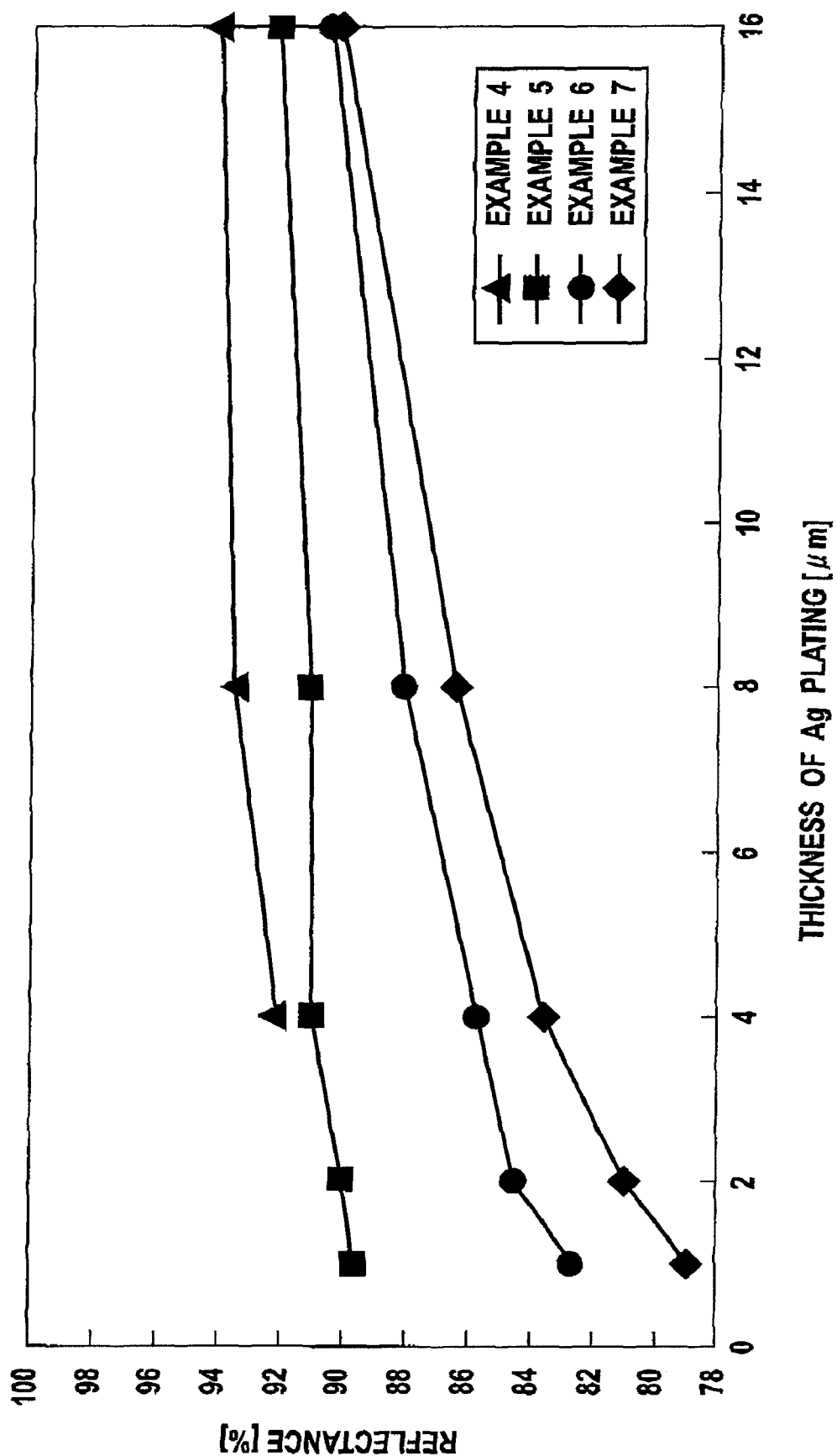
FIG. 7 is a diagram showing a change in reflectance of a silver plated layer which accompanies a change in film thickness of the silver plated layer.

By using a spectrophotometer (U 4000 by Hitachi, Ltd.), spectral reflectances of the silver plated layers of the Examples 4 to 7 for a visible light of a wavelength 400 nm after changes in film thickness of the silver plated layers were measured. As shown in FIG. 7, when a substrate material is copper (Examples 4 and 5), a high reflectance is obtained when the silver plated layer is 1 μm or more. When a substrate material is nickel (Examples 6 and 7), a high reflectance is obtained when the silver plated layer is 4 μm or more. Additionally, comparison between the Examples 6 and 7 shows that a higher reflectance can be realized when the nickel plated layer contains no sulfur

[Heating]

Silver plated layers of Examples 8 to 10 were formed by methods described below. Spectral reflectances of the silver plated layers of the Examples 8 to 10 for lights of wavelength areas of 300 to 800 nm were measured.

EXAMPLE 8

According to the Example 8, the silver plated layer of the Example 1 was subjected to reflowing at a temperature of 320° C. in a nitrogen atmosphere of a residual oxygen concentration of 500 ppm for 30 seconds to obtain a silver plated layer of the Example 8.

EXAMPLE 9

According to the Example 9, the silver plated layer of the Example 1 was directly used as the silver plated layer of the Example 9.

EXAMPLE 10

According to the Example 10, the silver plated layer of the Example 1 was subjected to reflowing at a temperature of 150° C. in a nitrogen atmosphere of a residual oxygen concentration of 500 ppm for 1 hour to obtain a silver plated layer of the Example 10.

[Evaluation]

Figure 8:
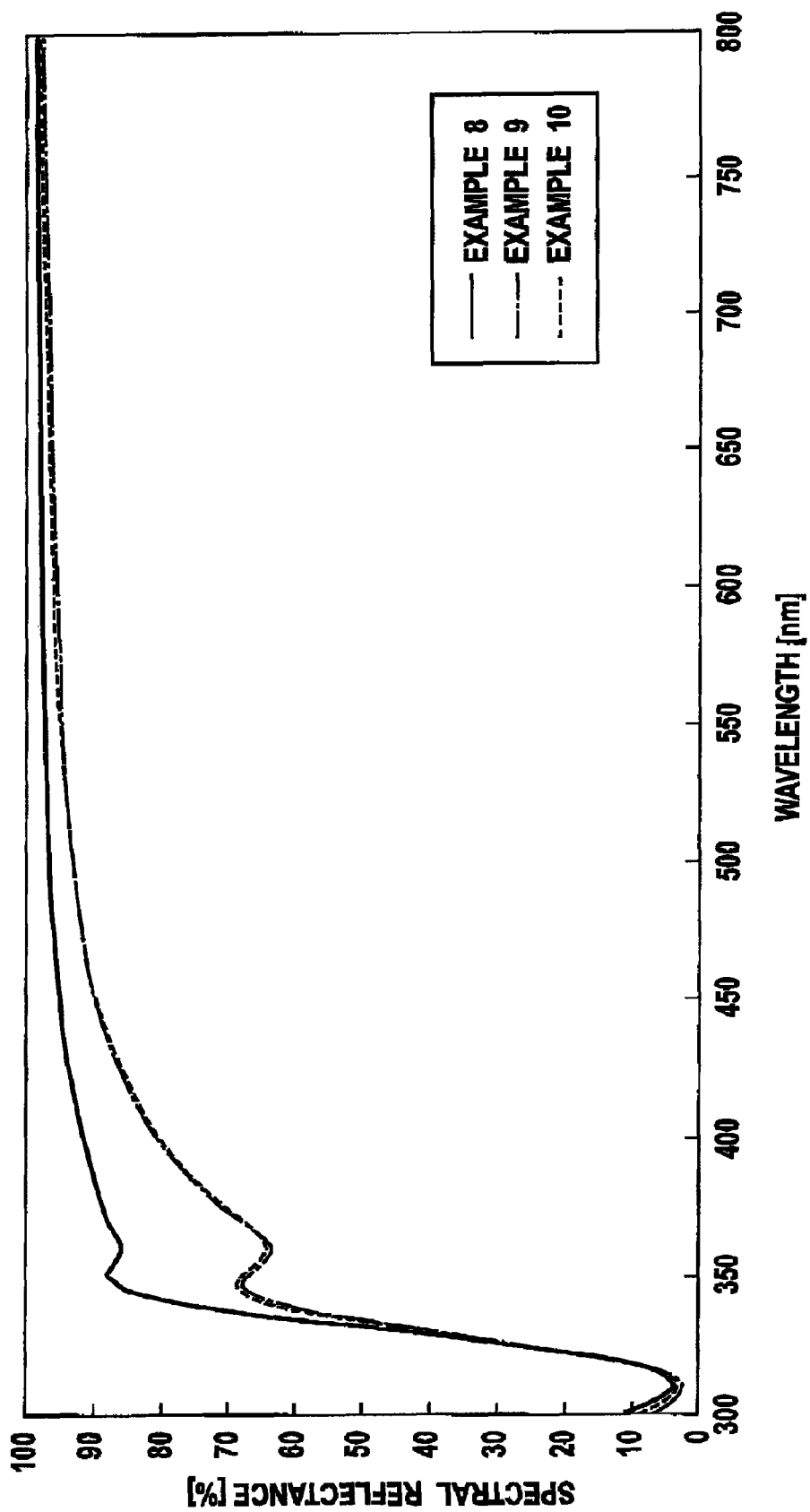
FIG. 8 is a diagram showing a change in reflectance of a silver plated layer which accompanies heating of the silver plated layer.

By using a spectrophotometer (U 4000 by Hitachi, Ltd.), spectral reflectances of the Examples 8 to 10 for wavelength areas of 300 to 800 nm were measured. As shown in FIG. 8, the silver plated layer is subjected to reflowing at 300° C. in a nitrogen atmosphere for 1 minute (Example 8), especially a reflectance for a light of a wavelength 400 to 500 nm is increased, and a reflectance for the light of the wavelength 400 nm is 90% or more. This is because heating reduces a grain size of the silver plated layer.

[Type of Bath]

Silver plated layers of Examples 11 and 12 and Comparative Examples 3 and 4 were formed by methods described below. Spectral reflectances of the silver plated layers of the Examples 11 and 12 and the Comparative Examples 3 and 4 for lights of wavelength areas of 300 to 800 nm were measured.

EXAMPLE 11

According to the Example 11, a substrate including a copper plated layer was dipped in a low cyan bath of a silver concentration of 65 g/l, a free cyanide concentration 2 g/l and a brightening agent concentration of 0 ml/l. The substrate was subjected to electrosilvering at a temperature 30° C. for 190 seconds by setting a current density to 2 A/dm² to obtain a silver plated layer of the Example 11 on the copper plated layer of a film thickness of 4 μm.

EXAMPLE 12

According to the Example 12, a substrate including a copper plated layer was dipped in a low cyan bath of a silver concentration of 65 g/l, a free cyanide concentration of 2 g/l, and a brightening agent concentration of 10 ml/l. The substrate was subjected to electrosilvering at a temperature 30° C. for 190 seconds by setting a current density to 2 A/dm² to obtain a silver plated layer of the Example 12 on the copper plated layer of a film thickness of 4 μm.

COMPARATIVE EXAMPLE 3

According to the Comparative Example 3, a substrate including a copper plated layer was dipped in a high cyan bath of a silver concentration of 40 g/l, a free cyanide concentration of 120 g/l, a potassium carbonate concentration of 30 g/l, and a brightening agent concentration of 30 ml/l. The substrate was subjected to electrosilvering at a temperature 25° C. for 190 seconds by setting a current density to 2 A/dm² to obtain a silver plated layer of the Comparative Example 3 on the copper plated layer of a film thickness of 4 μm.

COMPARATIVE EXAMPLE 4

According to the Comparative Example 4, a substrate including a copper plated layer was dipped in a non-cyan bath of a silver concentration of 30 g/l, and a brightening agent concentration of 1.5 ml/l. The substrate was subjected to electric nickel plating at a temperature of 25° C. for 380 seconds by setting current density to 1 A/dm² to obtain a silver plated layer of the Comparative Example 4 on the nickel plated layer of a film thickness of 4 μm.

[Evaluation]

By using a spectrophotometer (U 4000 by Hitachi. Ltd.), spectral reflectances of the silver plated layers of the Examples 11 and 12 and the Comparative Examples 3 and 4 for lights of wavelengths 300 nm and 800 nm were measured. As shown in FIG. 9, when the silver plated layer is formed by a low-cyan bath containing no brightening agent (Example 11), the silver plated layer exhibits a higher reflectance.

What is claimed is:

1. A silver layer formed by electrosilvering a substrate material, wherein a grain size of an outermost surface is within a range of 1 μm or more to 30 μm or less, and wherein a surface roughness Ry of the substrate material is 0.5 μm or more, and wherein a reflectance of the silver layer is within a range of 90 to 99% in a wavelength range between 400 to 700 nm.

2. The silver layer according to claim 1, wherein a silver plated layer has a film thickness of 1 μm or more, and the substrate material is formed of copper.

3. The silver layer according to claim 1, wherein a silver plated layer has a film thickness of 4 μm or more, and the substrate material is formed of nickel.

4. The silver layer according to claim 3, wherein the substrate material contains no sulfur.

5. A method for manufacturing the silver layer according to claim 1, comprising the steps of:

heating a silver plated layer at a temperature of 200° C. or more for 30 seconds or more after the electrosilvering.

6. A method for manufacturing the silver layer according to claim 1, comprising the steps of:
carrying out the electrosilvering by low-cyan bathing.

7. A LED mounted substrate comprising, the silver layer according to claim 1 as a reflective surface.

8. A method for manufacturing the LED mounted substrate according to claim 7, comprising the steps of:
forming a conductive layer on a substrate surface;
patterning the conductive layer to form a circuit pattern;
forming a copper plated layer on the circuit pattern;
forming a nickel plated layer on the copper plated layer; and
forming a silver plated layer on the nickel plated layer.

9. A light emitting diode package comprising:
a light emitting diode; and a LED mounted substrate mounting the light emitting diode, the LED mounted substrate comprising:
a substrate material; and
a silver layer as a reflective surface, wherein the silver layer comprises a silver plated layer formed by electrosilvering of the substrate material; a grain size of an outermost surface of the silver plated layer is within a range of 1 μm or more to 30 μm or less; and a surface roughness Ry of the substrate material is 0.5 μm or more,
and wherein a reflectance of the silver layer is within a range of 90 to 99% in a wavelength range between 400 to 700 nm.

10. The light emitting diode package according to claim 9, wherein the silver plated layer has a film thickness of 1 μm or more, and the substrate material is formed of copper.

11. The light emitting diode package according to claim 9, wherein the silver plated layer has a film thickness of 4 μm or more, and the substrate material is formed of nickel.

12. The light emitting diode package according to claim 11, wherein the substrate material contains no sulfur.

* * * * *